(12) United States Patent
Kubik

(10) Patent No.: US 9,377,327 B2
(45) Date of Patent: Jun. 28, 2016

(54) MAGNETIC FIELD DIRECTION SENSOR

(71) Applicant: ANALOG DEVICES GLOBAL, Hamilton (BM)

(72) Inventor: Jan Kubik, Raheen (IE)

(73) Assignee: Analog Devices Global, Hamilton (BM)

(*) Notice: Subject to any disclaimer, the term of this patent is extended or adjusted under 35 U.S.C. 154(b) by 246 days.

(21) Appl. No.: 13/931,148

(22) Filed: Jun. 28, 2013

(65) Prior Publication Data

US 2015/0002142 A1  Jan. 1, 2015

(51) Int. Cl.
*G01D 5/16* (2006.01)
*G01R 33/00* (2006.01)
*G01R 33/09* (2006.01)
*G01R 33/02* (2006.01)

(52) U.S. Cl.
CPC .............. *G01D 5/16* (2013.01); *G01R 33/0005* (2013.01); *G01R 33/0094* (2013.01); *G01R 33/02* (2013.01); *G01R 33/09* (2013.01)

(58) Field of Classification Search
CPC ........... G01D 5/14; G01D 5/145; G01D 5/16; G01R 33/0005; G01R 33/0017; G01R 33/0035; G01R 33/0094; G01R 33/07; G01R 33/075; G01R 33/096; G01R 33/09; G01R 33/091; G01R 33/093
See application file for complete search history.

(56) References Cited

U.S. PATENT DOCUMENTS

| | | | | |
|---|---|---|---|---|
| 5,585,775 A * | 12/1996 | Ishishita | ..................... | 338/32 R |
| 6,100,686 A | 8/2000 | Van Delden et al. | | |
| 6,304,074 B1 * | 10/2001 | Waffenschmidt | ........ | G01B 7/30 324/202 |
| 6,335,081 B1 | 1/2002 | Araki et al. | | |
| 6,433,535 B1 * | 8/2002 | Marx | ........................ | G01D 5/16 324/207.21 |
| 8,486,723 B1 * | 7/2013 | Wan | ........................ | H01L 27/22 257/421 |
| 2002/0006017 A1 | 1/2002 | Adelerhof | | |
| 2003/0151406 A1 | 8/2003 | Wan et al. | | |
| 2004/0080872 A1 * | 4/2004 | Sato | ........................ | B82Y 25/00 360/316 |
| 2006/0103373 A1 | 5/2006 | Ricks et al. | | |
| 2006/0171081 A1 * | 8/2006 | Brcuer | ............... | G01R 33/0206 360/313 |
| 2009/0027048 A1 * | 1/2009 | Sato et al. | ...................... | 324/247 |
| 2009/0189601 A1 * | 7/2009 | Okada | .................... | B82Y 25/00 324/207.21 |
| 2010/0321010 A1 | 12/2010 | van Veldhoven et al. | | |
| 2011/0018533 A1 | 1/2011 | Cesaretti et al. | | |

(Continued)

FOREIGN PATENT DOCUMENTS

| CN | 202 013 413 | 10/2011 |
|---|---|---|
| DE | 44 38 715 | 5/1996 |

(Continued)

OTHER PUBLICATIONS

Magnetic Field Sensor KMR 360, HLPLANAR Technik, *HL-Planartechnik GmbH* 4 pages, accessed at: http://www.meas-spec.cn/manage/sensortypes/KMR360eng.pdf, May 12, 2003.

(Continued)

*Primary Examiner* — Tung X Nguyen
*Assistant Examiner* — David Frederiksen
(74) *Attorney, Agent, or Firm* — Knobbe Martens Olson & Bear LLP

(57) ABSTRACT

A magnetic direction sensor, comprising a first array of magneto-resistive elements, said array having a first array primary direction and wherein some but not all of the magneto-resistive elements are wholly or partially provided at a first angle to the primary direction, and the remaining elements are also inclined with respect to the primary direction.

20 Claims, 14 Drawing Sheets

(56) References Cited

U.S. PATENT DOCUMENTS

| | | | |
|---|---|---|---|
| 2011/0031960 A1 | 2/2011 | Hohe et al. | |
| 2011/0074399 A1* | 3/2011 | Bartos | G01D 5/145 324/207.21 |
| 2013/0099783 A1 | 4/2013 | Kubik | |
| 2014/0028307 A1* | 1/2014 | Ausserlechner | 324/252 |
| 2014/0035570 A1 | 2/2014 | Jin et al. | |

FOREIGN PATENT DOCUMENTS

| | | |
|---|---|---|
| DE | 198 10 838 | 9/1999 |
| DE | 198 39 446 | 3/2000 |
| DE | 198 39 450 | 3/2000 |

OTHER PUBLICATIONS

AS5030 Datasheet, 44 pages, © 1997-2013; ams AG; printed on Jul. 29, 2013 from: http://www.ams.com/eng/content/download/11929/212604/file/AS5030_Datasheet_v2-4.pdf.

KMZ43T Magnetic Field Sensor Product data sheet, NXP B.V., Mar. 4, 2009, 8 pages, downloaded from: http://www.nxp.com/documents/data_sheet/KMZ43T.pdf.

KMA221 Programmable angle sensor product data sheet, Jul. 16, 2013, NXP B.V., downloaded from: http://www.nxp.com/documents/data_sheet/KMA221.pdf.

AN211 Application Note: Applications of Magnetic Position Sensors, Honeywell Sensor Products, 8 pages, 01-02 Rev. Printed on Jul. 29, 2013. Downloaded from: http://www51.honeywell.com/aero/common/documents/Applications-of-Magnetic-Position-Sensors.pdf.

Magnetic Displacement Sensors, HMC1501/1512, Honeywell, 8 pages, Dec. 2010, downloaded from: http://www51.honeywell.com/aero/common/documents/myaerospacecatalog-documents/Missiles-Munitions/HMC1501-1512.pdf.

Axel Bartos, Principle of a 360° Measurement Utilizing HL Planar's Sensor KMR360, HLPLANAR Technik,Jan. 18, 2005, 10 pages. Originally available from: http://www.hlplanar.de.

U.S. Appl. No. 13/655,059, filed Oct. 18, 2012.

Sensitec AA747 MagnetoResistive Angle Sensor, Oct. 28, 2009, 5 pages, downloaded from: http://www.sensitec.com/upload/SENSITEC/PDF_Downloads/Datenblatt/Sensitec_AA747_DSE_04.pdf.

Extended European Search Report of Mar. 19, 2015 for European Application No. 14173535.7, filed Jun. 23, 2014, 8 pages.

* cited by examiner

MAGNETIC FIELD DIRECTION SENSOR

FIELD

The present disclosure relates to a magnetic field direction sensor, and a method of achieving improvement in sensor performance compared to known sensors.

BACKGROUND

Magnetic field direction sensors can be used to measure orientation of a magnetic field generating object, such as a permanent magnet, with respect to a sensing axis of a magnetic field direction sensor. Thus, when the magnet is carried on a rotating object, such as a shaft whose position is to be encoded, the angular position of the shaft can be determined in a non-contacting manner. Such contactless operation can give excellent sensor longevity. Similarly the rate of rotation of a rotating object may also be determined by such a magnetic field direction sensor. There are many uses where it is desirable to know the rotational position of the shaft, for example to determine crank shaft position within an internal combustion engine.

SUMMARY

This document discloses a method for improving the performance of a magnetic field direction sensor employing magneto-resistive elements by forming advanced and delayed responses so as to correct for errors in a response characteristic of the magnetic field direction sensor.

This document also discloses a magnetic field sensor having sensing elements orientated on a substrate so as to reduce shape anisotropy errors within the magnetic field sensor.

In an embodiment there is provided a magnetic direction sensor, comprising a first array of magneto-resistive elements, said array having a first array primary direction and wherein some but not all of the magneto-resistive elements are wholly or partially provided at a first angle to the primary direction, and the remaining elements are also inclined with respect to the primary direction.

In an embodiment the sensor has a notional sensing direction, which may also be referred to herein as a primary direction. The primary direction may lie parallel to a plane of a substrate that supports the magnetic field sensing elements, such as magneto-resistive elements. The sensing elements may be substantially linear. The sensing elements may be divided into groups that are inclined with respect to the primary direction such that no linear element lies parallel to the primary direction.

The permanent magnet is advantageously provided in an orientation such that it rotates in a plane that is substantially parallel with a plane of the substrate carrying the sensing elements. The substrate may be part of an integrated circuit. The integrated circuit may include signal processing components such as differential amplifiers, ADC's and digital processing circuits. The sensing elements need not be exposed on the surface of the substrate and may be provided such that they are bounded by other materials.

The errors in the response characteristic may be deviations from an idealized performance resulting from shape anisotropy within one or more magneto-resistive elements of the magnetic direction sensor and/or crystal anisotropy induced during deposition or further processing of the magneto-resistive material. Such a magnetic direction sensor may comprise one or a plurality of magneto-resistive elements formed so as to have a primary direction. Where the magneto-resistive elements are generally elongate and arranged parallel with one another, as for example in prior art sensors, the primary direction is generally parallel to a longitudinal axis of the magneto-resistive elements. Put another way, each individual element has a sensing direction, which lies parallel with the longitudinal axis of an individual element. The resistance versus magnetic field direction response characteristic is substantially symmetrical about the sensing direction of each individual element. In prior art sensors the individual elements are laid parallel to one another and connected such that the current flow occurs in a back and fourth manner through an array of such sensors. For this prior art configuration the primary direction of the array is parallel to the individual sensing directions of the sensors used to form the array. In embodiments disclosed herein the primary direction lies at an angle with respect to the longitudinal axis of one or more of the sensing elements. The sensing elements are often provided as generally elongate elements due to the desire to limit the current flow through the or each magneto-resistive element when driven in a voltage mode, and hence to get the resistance of the sensor up. This can be achieved by making the elements much longer than their width. However making such elongate elements starts to build in a shape anisotropy into each elongate magneto-resistive element. Increasing the length to width ratio increases the shape anisotropy within the magneto-resistive element thereby giving rise to increased deviation between the actual response and the idealized response. However this approach does provide enhanced sensor resistance, and therefore less power consumption by a sensor when driven at any particular supply voltage.

The contribution within the sensor response resulting from shape anisotropy can be made less significant by the use of a stronger magnetic field in the vicinity of the magnetic field direction sensor. This can be achieved by the use of a stronger magnet, closer coupling, or both of these techniques. However stronger magnets incur additional costs and may take up more volume. Physical volume constraints concerning the placement of a magnet in a working environment, and potentially the need to limit the effect of stray magnetic fields interfering with other components or giving rise to eddy current heating may mitigate against the use of stronger magnetic fields. It can therefore be seen that improving the performance of the sensor by reducing errors therein may allow sensor performance to be maintained within acceptable limits with the use of weaker magnets or greater magnet to sensor coupling distances.

In an embodiment the advanced responses are provided by providing at least one, and preferably several, magneto-resistive elements that are offset by a first angle with respect to the primary direction. Alternatively a portion of the or each magneto-resistive element may be set at the first angle. The delayed responses may be provided by forming at least one, and preferably several, magneto-resistive elements that are offset by a second angle with respect to the primary direction. Alternatively a portion of the magneto-resistive elements may be set at the second angle. The first and second angles are, in some embodiments, of opposite sign to one another.

Further advanced responses may be achieved by forming a further plurality of magneto-resistive elements at a third angle with respect to the primary direction. Similarly further delayed responses may be formed by providing a further plurality of magneto-resistive elements at a fourth angle with respect to the primary direction. In some embodiments having elements formed at first to fourth angles a plurality of magneto-resistive elements may be formed parallel with the primary direction.

The magneto-resistive elements may be grouped together to form individual sensing arrays. The sensing arrays may themselves be grouped together to form a sensor. Thus, for example, a sensing array having a sensing direction along a first axis may be provided in association with a second sensing array having a sensing direction which is substantially orthogonal to that of the first sensing array. Such an arrangement provides enhanced sensitivity. The first and second sensing arrays may be arranged in series and a voltage at a node interconnecting the arrays may be compared with a reference voltage. The reference voltage may be generated from a voltage source or may in fact be generated from a further pair of series connected sensing arrays. Thus first to fourth arrays may be arranged to form a sensor bridge.

In some embodiments such a sensor bridge may be associated with a second sensor bridge formed of substantially identically mutually orientated sensor arrays, except for the fact that the structure is rotated through, for example, 45°. By using outputs from the first and second sensor bridges it is possible to obtain a linear response over a range of 180°. If the output of the first bridge is V1, where V1 is a function of an angle θ between the direction of an applied magnetic field and the primary direction, and output of the second bridge is V2, where V2 is also a function of the angle θ, then a substantially linear response D corresponding to the magnetic field angle can be calculated as $$D = 0.5 \text{ Atan } 2(V2, V1)$$

The function "Atan 2" is provided as a standard function in many computer languages and is an arctangent function with two arguments. The use of two arguments instead of a single argument is to allow the function to gather information concerning the sign of the arguments and to return the appropriate quadrant for the computed angle. This is not possible with an arctangent function employing only a single argument.

The first and second sensor bridges may be associated with operational amplifiers to form V1 and V2, and outputs of the operational amplifiers may then be processed in analog, digital or hybrid electronics to calculate the angle of the magnetic field. All of the components may be provided in an integrated circuit.

In a further embodiment there is provided a magnetic direction sensor comprising a first array of magneto-resistive elements, said array having a first array primary direction, and wherein some but not all of the magneto-resistive elements are wholly or partially provided at a first angle with respect to the primary direction.

Advantageously the first plurality of the magneto-resistive elements or portions of the magneto-resistive elements are orientated at the first angle with respect to the primary direction, and a second plurality of magneto-resistive elements or portions of the second plurality of magneto-resistive elements provided at a second angle with respect to the first array primary direction. In some embodiments there are no magneto-resistive elements arranged parallel with the primary direction.

The provision of tilted magneto-resistive elements with respect to the primary direction means that, as a magnetic field rotates with respect to the magnetic sensor, some of the elements provide a response which is in advance of that which would be provided by elements parallel to the primary direction, whereas some of the elements provide a response which is delayed compared to that which would be provided by elements provided parallel to the primary direction.

BRIEF DESCRIPTION OF THE DRAWINGS

Embodiments will now be discussed by way of example only, with reference to the accompanying drawings, in which.

DETAILED DESCRIPTION OF SOME EMBODIMENTS

Figure 1:
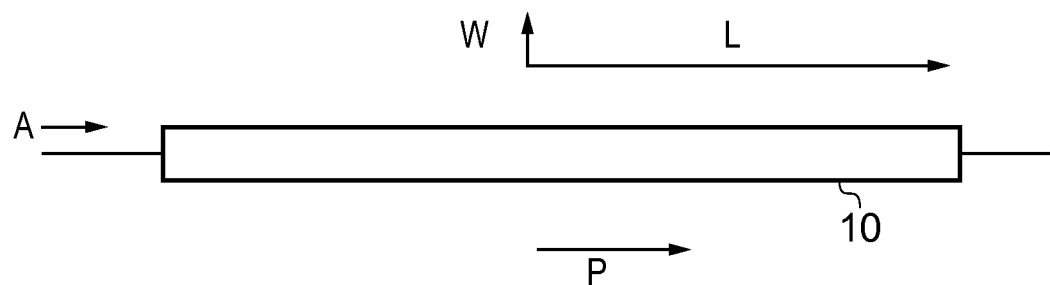
FIG. 1 schematically illustrates an elongate and linear magneto-resistive element having a current flowing through it along a first direction P, representing a sensing direction.

FIG. 1 schematically illustrates a single magneto-resistive sensing element, designated 10 which is provided in the form of an elongate linear strip of magneto-resistive material. Thus a length L of strip 10 is much greater than its width W. Although for diagrammatic simplicity the sensing element 10 has been drawn as an elongate rectangle, the ends of the element 10 may be profiled to have a non-rectangular form, for example they may be rounded or enlarged. Similarly the width of the strip need not be constant along the length. In use the strip carries a current A which propagates along the direction L. The magneto-resistive material is typically made of a mixture of nickel and iron as is known to the person skilled in the art. The application of an external magnetic field causes a magnetization vector M within the strip 10 to be aligned with the direction of the external magnetic field, and the resistance of the strip is a function of the angle between the direction of the magnetization vector and the direction of the current flow within the strip. For such direction sensors the magnetic field is generally chosen so as to be sufficiently large such that the magneto-resistive material is in magnetic saturation. Generally this change in resistance can be modeled a cosine function superimposed on a non-changing resistance value. A proportion of the resulting magnetization vector, herein labeled H in FIG. 2 originates from the presence of the external magnetic field. However another portion herein labeled I results from shape anisotropy and crystal anisotropy and this portion I is largely confined by the geometry of the strip. The relative magnitudes of H and I are not drawn to scale, and in a working sensor the strength of the external magnetic field is selected such that H is much greater than I. As a consequence a resulting magnetization vector, labeled $M_{TOT}$, resulting from the interaction of H and I can be considered as having a constant magnitude.

Figure 2A:
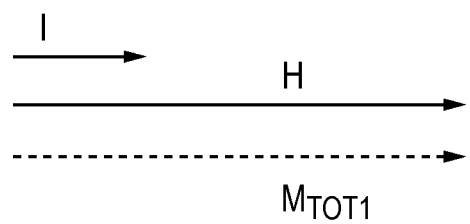
FIGS. 2a and 2b schematically show the interaction between an external magnetic field H and a shape induced anisotropy vector I to set a direction of a magnetization vector M within the magneto-resistive material.
Figure 2B:
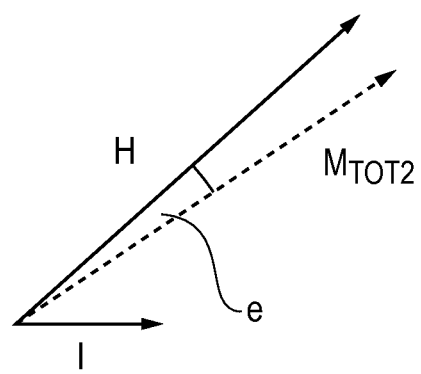

As shown in FIG. 2a, when H is parallel to I, then $M_{TOT}$ is also parallel to H and I, and can be considered as having a magnitude $M_{TOT1}$. However when H is inclined with respect to I, as shown in FIG. 2b, the overall magnetization vector $M_{TOT}$ becomes inclined with respect to H by an error angle "e". The size of "e" has been exaggerated in FIG. 2b for diagrammatic clarity. The magnitude of the magnetization can be represented as $M_{TOT2}$, and we see that $M_{TOT2}$ is substantially equal to $W_{an}$. The angular error "e" can be reduced by applying a stronger external magnetic field, but similarly the effect of the shape anisotropy becomes increased if the external magnetic field decreases for example due to increased distance between the magnet generating the magnetic field and the position of the sensor. Real world constraints may limit the minimum distance between the magnet and the sensor in a given application.

Figure 3A:
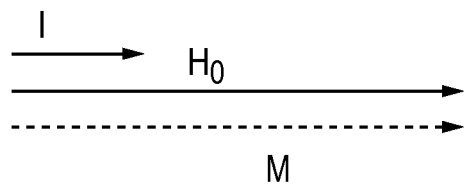
FIGS. 3a to 3f schematically present the interaction of the shape anisotropy I and an external magnetic field H at angles zero, 45, 88, 92, 135 and 180° with respect to a sensing direction.
Figure 3B:
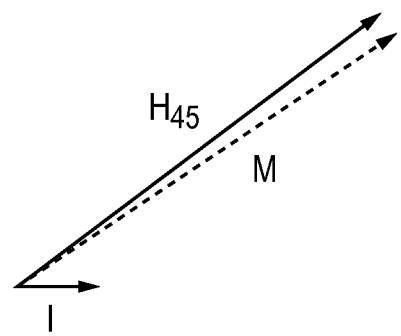
Figure 3C:
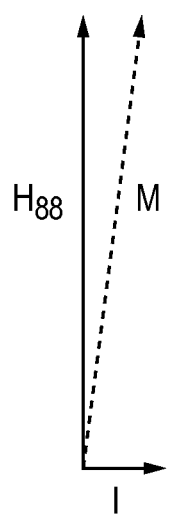
Figure 3D:
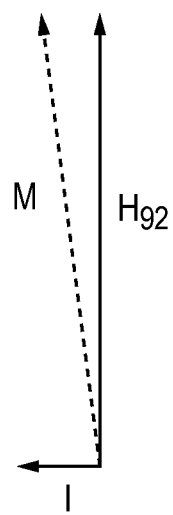
Figure 3E:
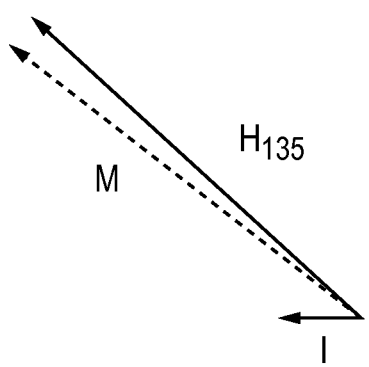
Figure 3F:
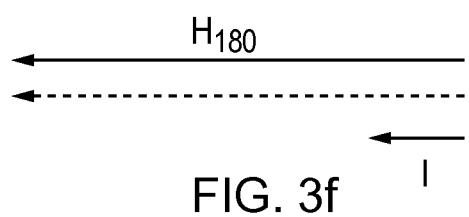

FIGS. 3a to 3f schematically illustrate this interaction between H and I, and the direction of the magnetization vector M over a series of angles. Thus, starting with FIG. 3a, the external magnetic field H at angle zero, represented as $H_0$, is aligned with I. Thus the resulting direction of the magnetization vector M is parallel to $H_0$. As the external field H rotates away from the direction of I (this rotation being anticlockwise in these diagrams), then the interplay of H and I results in a magnetization M which is not aligned with the direction H. Thus, as shown in FIG. 3b when H is at an angle of 45° the action of the magnetic anisotropic component I causes the vector M to lag behind $H_{45}$. This lag is maintained as the magnetic vector H rotates round. Thus, as shown in FIG. 3c where H is illustrated at an angle of 88°, the amount of lag will now be approaching a maximum value. The shape anisotropic component I exists parallel to the elongate direction of the sensing element, but is equally happy facing in one direction as another. Therefore, as the H field passes through 90° and continues rotating, for example as shown in FIG. 3d at an angle of 92°, the shape anisotropy component I can flip direction. Therefore the overall magnetization vector M suddenly jumps from lagging the external magnetic field to leading it. This leading continues all the way through as the magnetic field rotates from 90° to 180°, as shown by FIGS. 3e and 3f, respectively, with the amount of lead reducing until such time as it is reduced to zero. As the external magnetic field vector H continues to rotate then the total magnetic field M lags behind H through an angular range of 180° to 270°, and then starts to lead it again in the range 270° to zero/360°.

Figure 4:
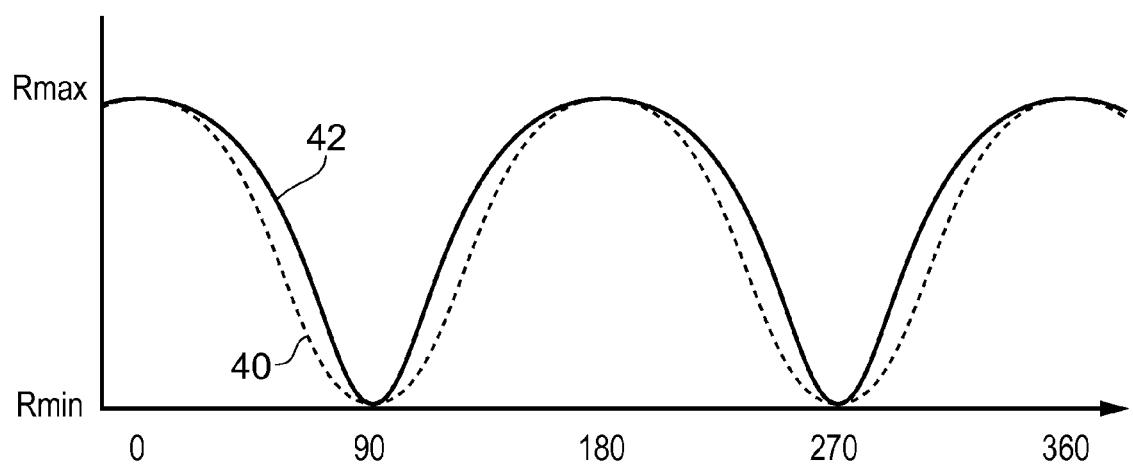
FIG. 4 compares the idealized and observed variation of resistance of the magneto-resistive sensor of FIG. 1 as the magnetic field direction H varies.

FIG. 4 compares the resistance of the magneto-resistive sensor 10 of FIG. 1 showing both the ideal response of the sensor and the actual response of the sensor normalized onto the same scale. It should be noted that the shape anisotropy of the sensor can be reduced by making its width W wider such that it becomes more comparable to the length of the sensor. Thus sensors having an aspect ratio of one to one, for examples squares or circles exhibit negligible shape anisotropy. However such sensors also exhibit a low resistance and hence can pass a significant amount of current when driven from a typical drive voltage, such as a few volts. The chain line 40 represents the idealized cosine response, in which the resistance starts at a maximum value $R_{max}$ when the external magnetic field is aligned with the direction of current flow through the sensor and hence aligned with the sensing direction of the magneto-resistive strip, and the resistance gradually decreases to a minimum value $R_{min}$ when the external magnetic field is perpendicular to the direction of current flow through the sensor.

When we consider the result of shape anisotropy as represented by curve 42, we can see that around the zero and 180° angles, the effect of shape anisotropy is to make the magnetic vector M linger closer to these values than it would normally do so. However, around the 90° and 270° values, flicking of the shape anisotropy from one side to the other causes the magnetization vector M to avoid these angles. This manifests itself in curve 42 being more rounded near the zero and 180° values, and sharper around the 90° and 270° values.

The inventor realized that this modification of the response, causing the actual response 42 to differ from the idealized response 40 could be partially reduced by adding phase shifted versions of the response to one another to compensate for the excessive "notchiness" illustrated in FIG. 4 around the 90° and 270° regions.

Figure 5:
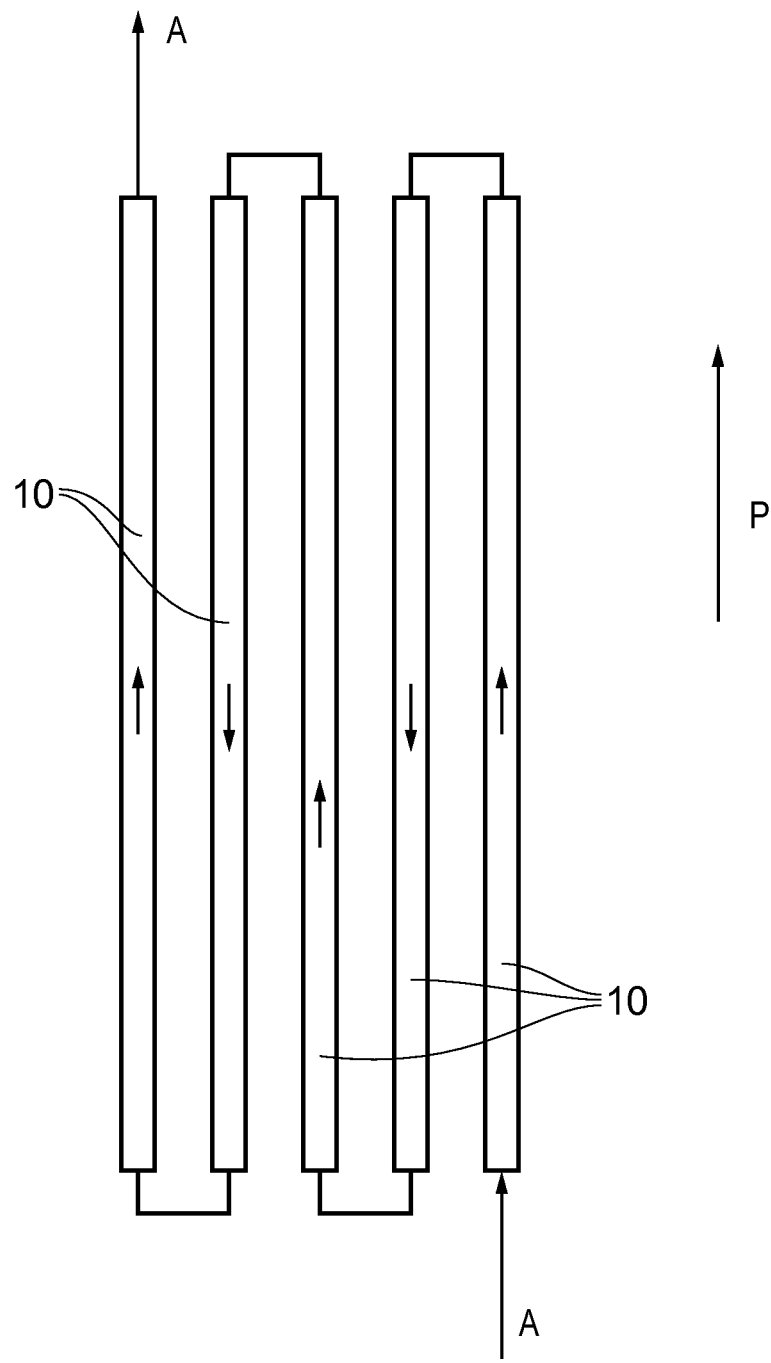
FIG. 5 schematically illustrates a known array of magneto-resistive elements where each element is parallel with the primary direction P.

Although, in FIG. 1, a single magneto-resistive element is shown, it is known to form arrays of such elements with the elements in the array being parallel to one another. Such an array is shown in FIG. 5. Thus a series of elements 10 are formed, each parallel to the primary direction P which constitutes the sensing direction of the array. The parallel elements are connected electrically in series so that the overall effect is that synthesize a very long strip of material. However, such an array will exhibit the distortion of curve 42 in FIG. 4.

Figure 6:
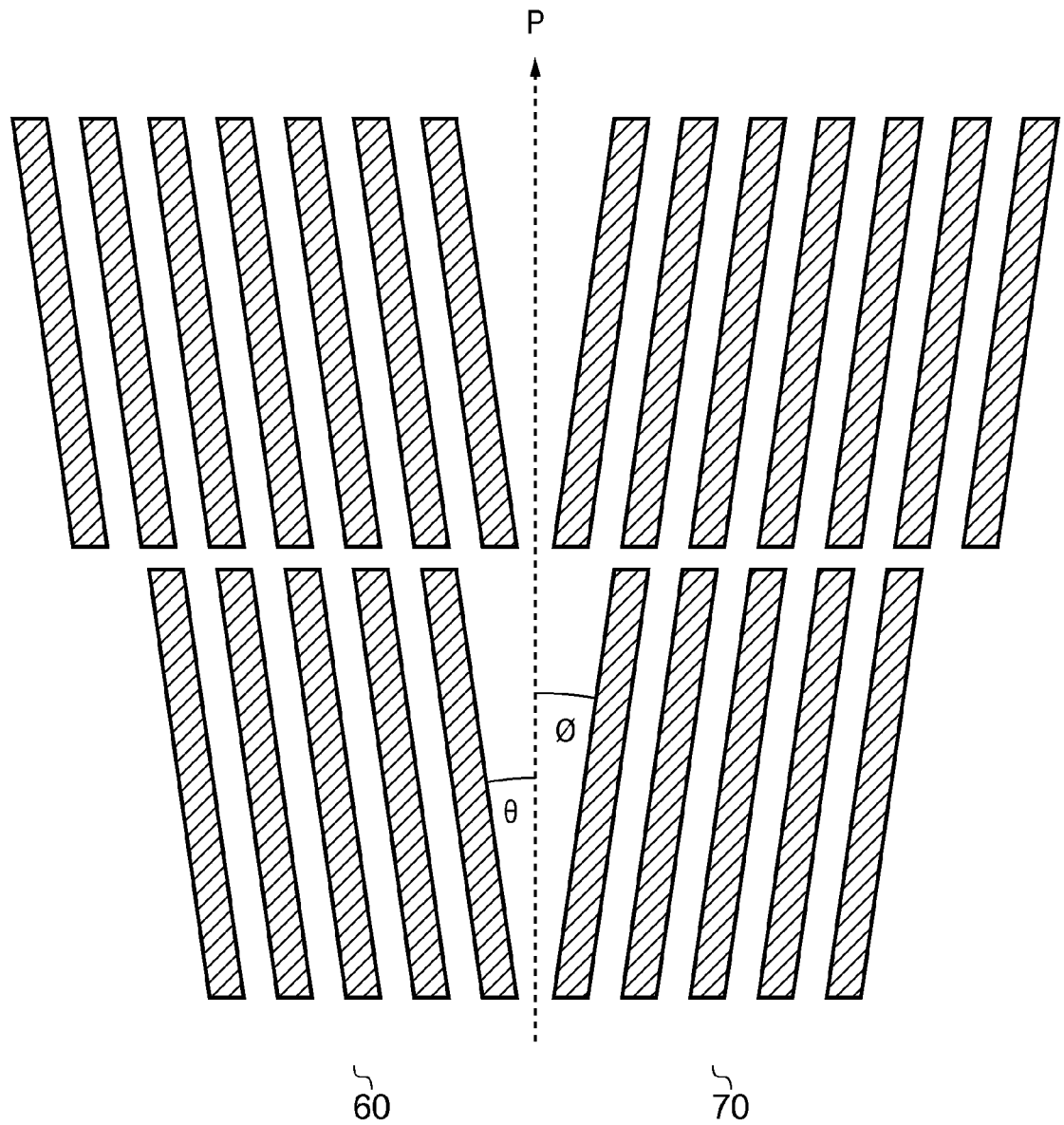
FIG. 6 schematically illustrates a magnetic field direction sensor comprising an array of magneto-resistive elements, where a first plurality of elements are inclined by a first angle with respect to a first array primary direction and a second plurality of magneto-resistive elements are inclined at a second angle with respect to the first array primary direction.

In the arrangement shown in FIG. 6, the plurality of magneto-resistive elements have been divided into two groups. A first group, generally designated 60 is inclined at a first angle of +θ with respect to the primary direction P. A second group of magneto-resistive elements, generally designated 70, is inclined at an angle φ with respect to the primary direction P. For convenience, although not necessarily an essential feature, φ=−θ. In this arrangement the magneto-resistive elements in the group 60 and 70 are symmetrically disposed about the primary direction P. Thus, compared to the prior art of FIG. 5, the array of strips has been split into two sub groups, each inclined with respect to the primary direction P such that, in this example, no strip of the array lies parallel to the direction P.

Figure 7:
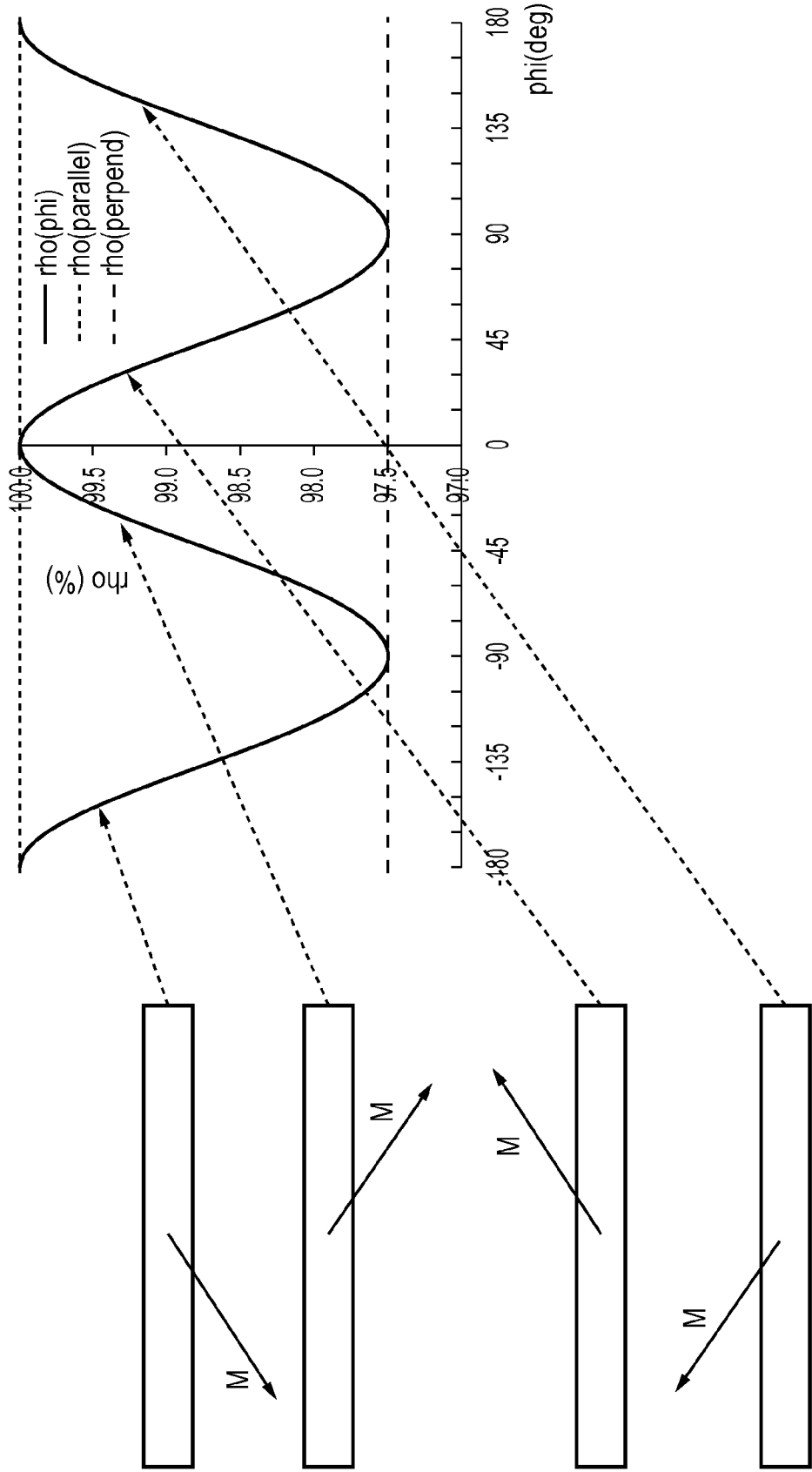
FIG. 7 schematically illustrates directional ambiguity for a sensor of the type shown in FIG. 1.
Figure 8:
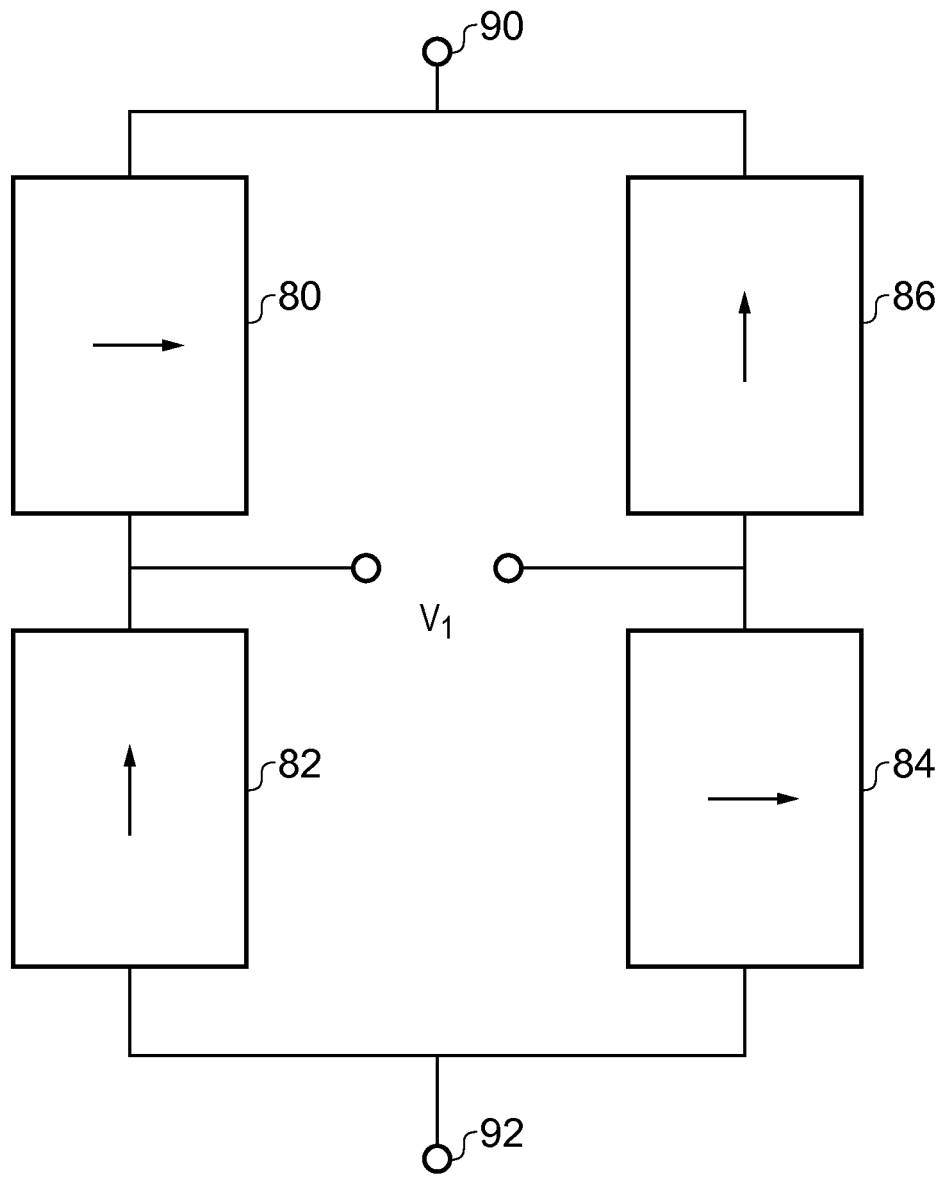
FIG. 8 schematically illustrates a bridge formed by first to fourth arrays of magneto-resistive elements.
Figure 8:
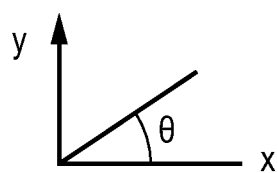

A known problem with single stripe magneto-resistive sensors is that they suffer from angular ambiguity. As shown in FIG. 7, four directions of the magnetization vector M produce exactly the same resistance value. In order to resolve this, it is known to connect multiple magneto-resistive sensors into two bridges. For completeness, a single bridge is described with respect to FIG. 8. The bridge comprises first to fourth arrays of magneto-resistive sensors 80, 82, 84 and 86 between first and second supply nodes 90 and 92. The first array 80 has its primary direction set along a first axis, for example parallel with respect to the X axis of FIG. 8. The first array 80 is connected in series with the second array 82 whose primary direction is orthogonal to that of the first array, for example parallel to the Y axis. To enhance sensitivity the first and second arrays form one limb of a bridge arrangement. The second limb of the bridge arrangement is formed by the third and fourth arrays with the primary direction of the third array 84 being parallel to that of the first array 80 and the primary direction of the fourth array 86 being parallel to that of the second array 82. The bridge output voltage V1 is provided by comparing the voltage at the node between the first and second arrays with the voltage at the node between the third and fourth arrays.

Figure 10:
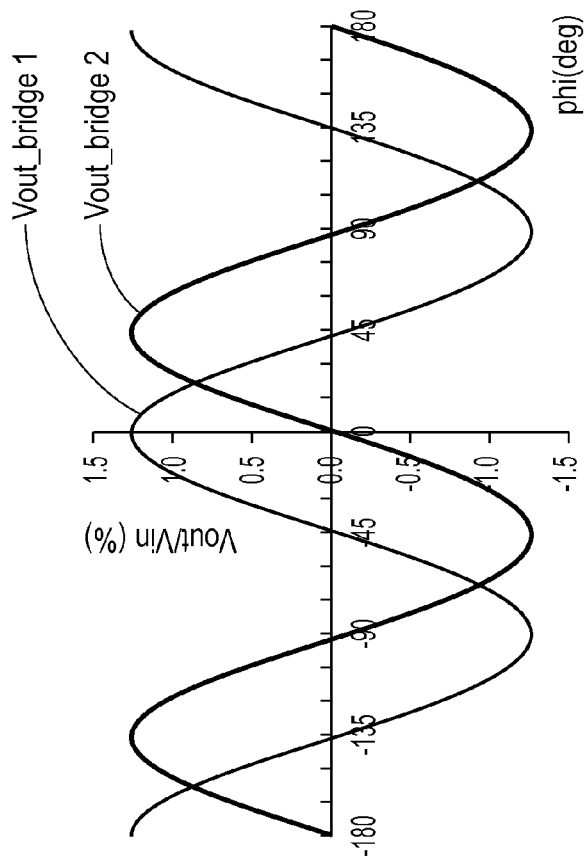
FIG. 10 compares the phases of the outputs of the arrays of FIG. 9.
Figure 9:
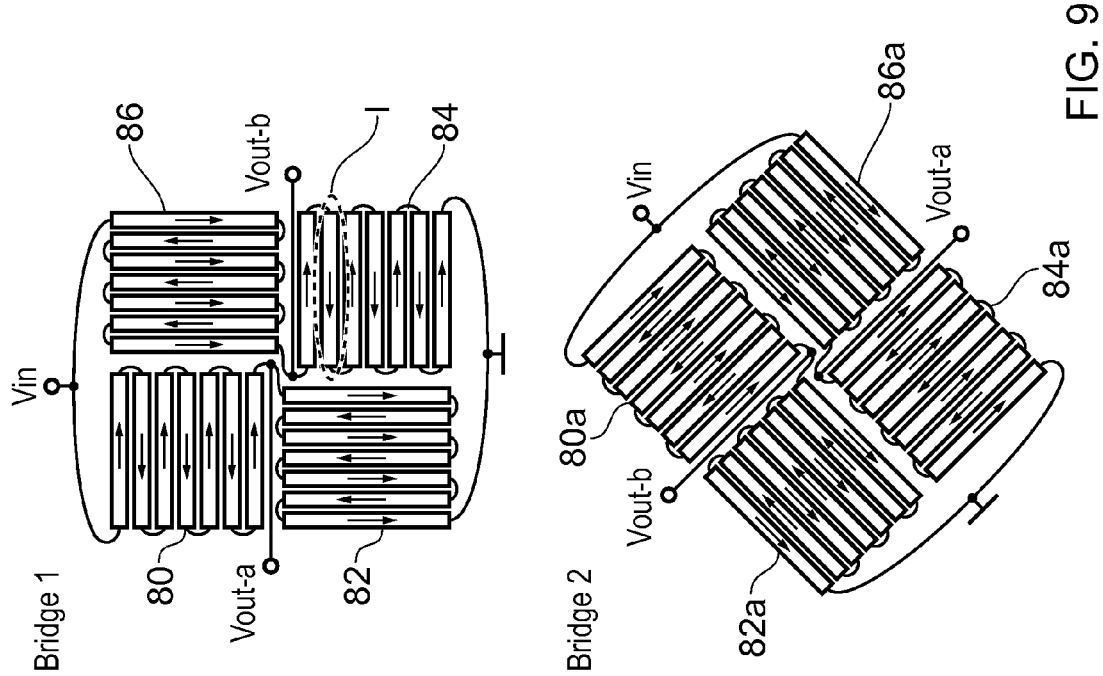
FIG. 9 schematically illustrates a sensor having two bridge arrays.
Figure 11:
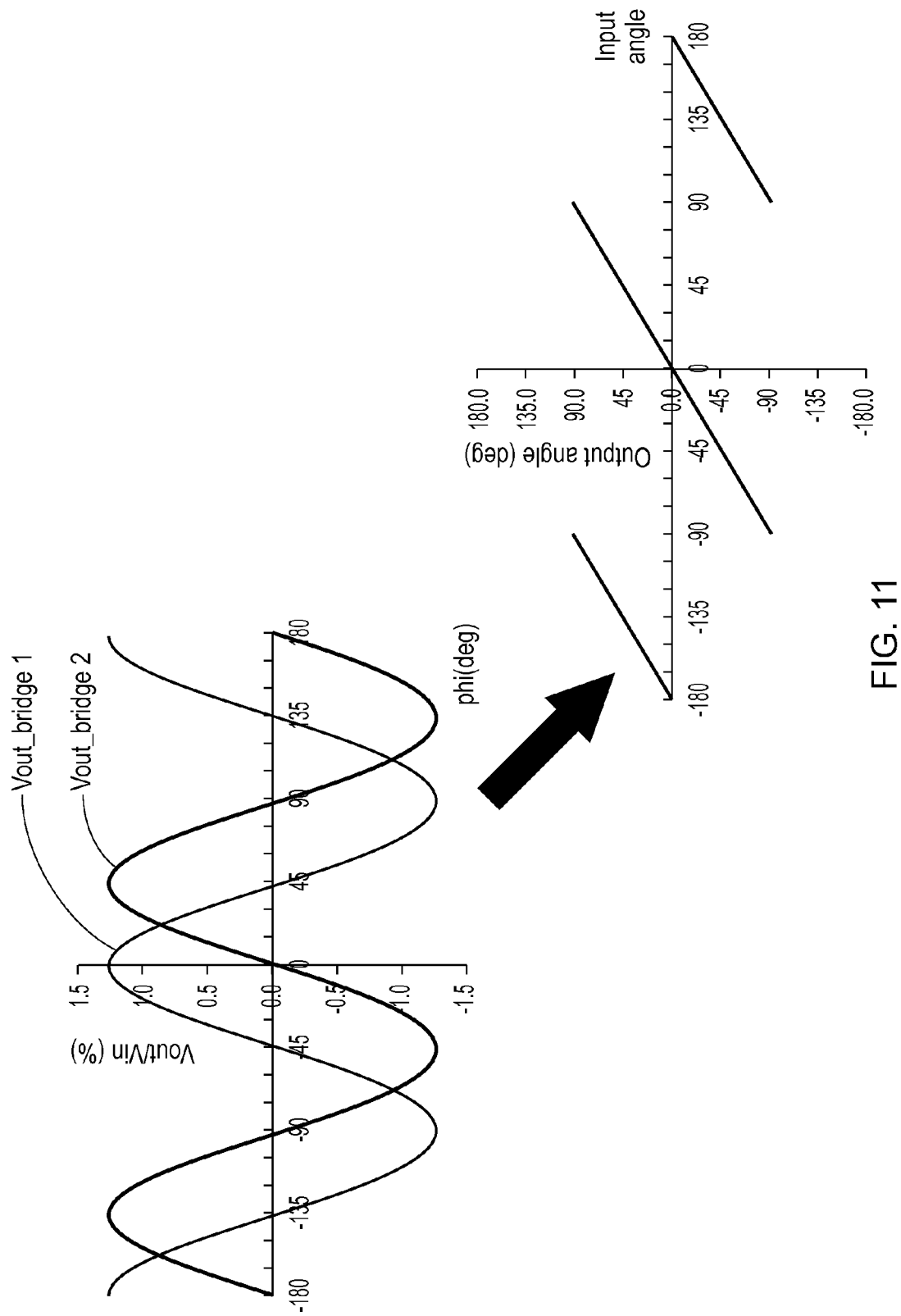
FIG. 11 illustrates how the output can be resolved by processing the outputs of the bridges to provide a substantially linear response over a range of 180°.

In order to provide accurate position sensing, a second bridge is formed, but this time it rotated by 45° with respect to the first bridge. Thus the second bridge may comprise first to fourth arrays 80a, 82a, 84a and 86a where the first array is at an angle of −45° with respect to the X axis, the second array is at an angle of +45°, and so forth. Such an arrangement is schematically illustrated in FIG. 9. FIG. 10 shows that the idealized output from one bridge for example bridge 1, is lagged by the idealized output from the other bridge, bridge 2, by 45°. The outputs of the bridges can be processed so as to provide a linear response over a range of 180° as shown in FIG. 11, and as discussed earlier $$V_{out} = 0.5 \text{ Atan } 2(V_2, V_1)$$

Figure 12A:
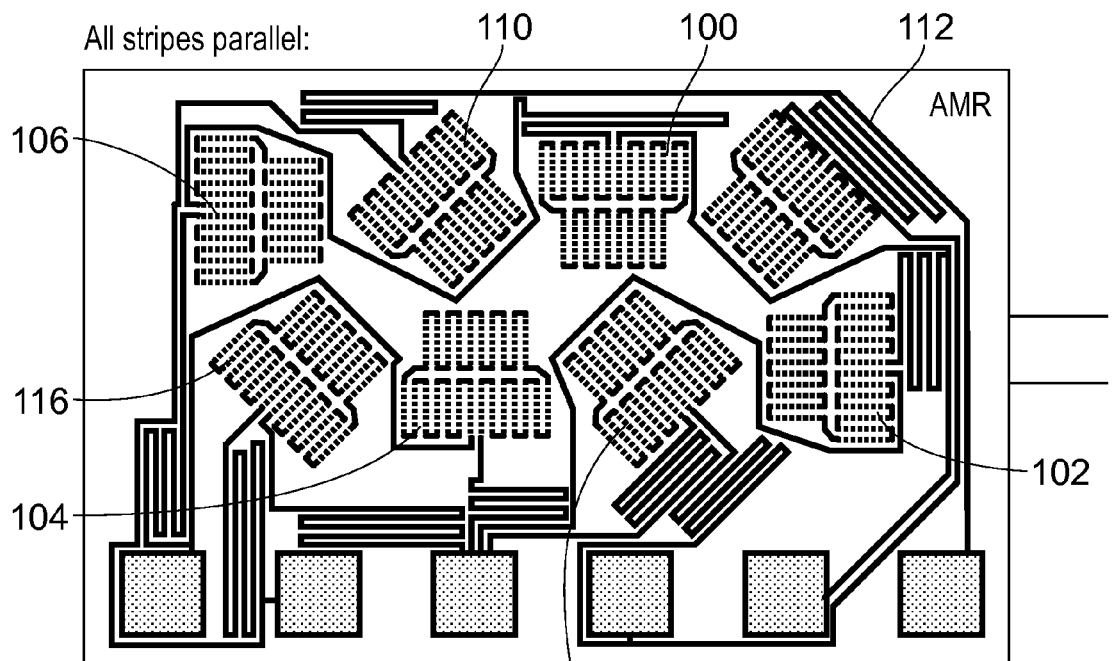
FIG. 12a shows a two-bridge array formed using prior art sensors (where the sensing elements are configured to be aligned with the primary direction of each array) and FIG. 12b compares the measured output of each of the two sensors with an idealized sinusoidal response.
Figure 12B:
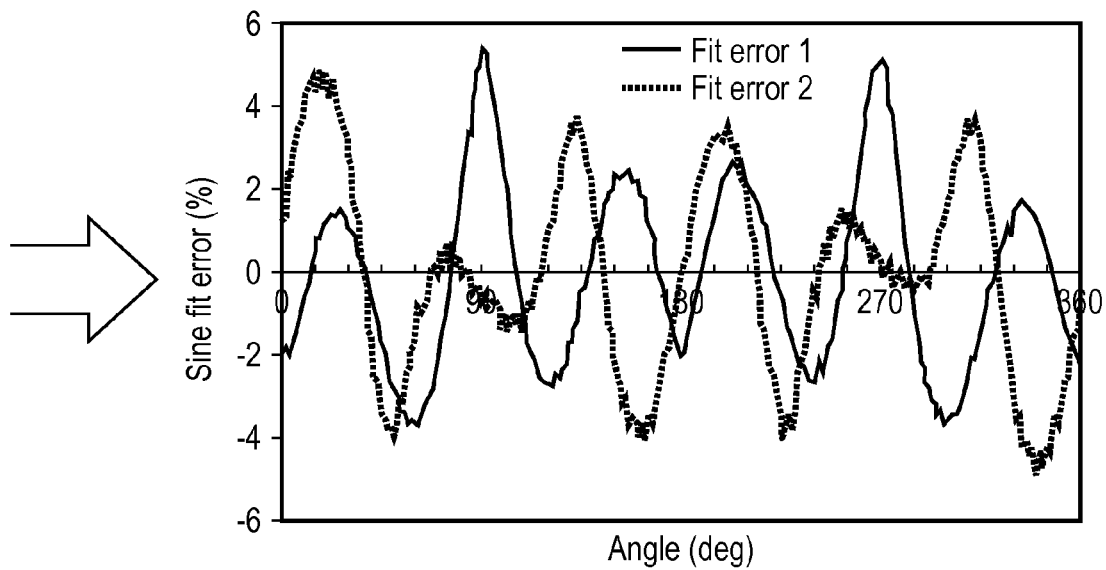

This approach assumes that both the sinusoids are idealized, and it follows that imperfections in the response of the type discussed herein with respect to FIG. 4 give rise to non-linearities in the sensors output characteristic. However, the relatively simple technique of forming advanced and delayed responses relative to the nominal response, and summing these provides an inexpensive and significant improvement. FIG. 12a is a plan view of a sensor comprising a first bridge formed of sensor arrays 100, 102, 104 and 106, and a second bridge rotated at 45° to the first bridge comprised of sensor arrays 110, 112, 114 and 116. The sensor arrays each comprise elongate magneto-resistive elements along a respective single direction. So the arrays 100 and 104 are along the Y direction (90°), arrays 102 and 106 are along the X direction (0°), arrays 112 and 116 are at 45°, and the arrays 114 and 110 are at 135°. Outputs from the arrays were recorded and were fitted to ideal sinusoids. Errors between the idealized and observed outputs are shown in FIG. 12b. If both the sensor arrays have been identically formed, then the fit error would have been identical. However the fit error "fit error 2" for the second array is slightly different to that from the fit error "fit error 1" of the first array which points to a manufacturing variation and/or the influence of crystal anisotropy between the arrays. It can be seen that for the example chip which was composed of magneto-resistive array comprising 24 magneto-resistive elements of length 50 microns and width 4 microns, then the fit error can peak at around 5%.

Figure 13A:
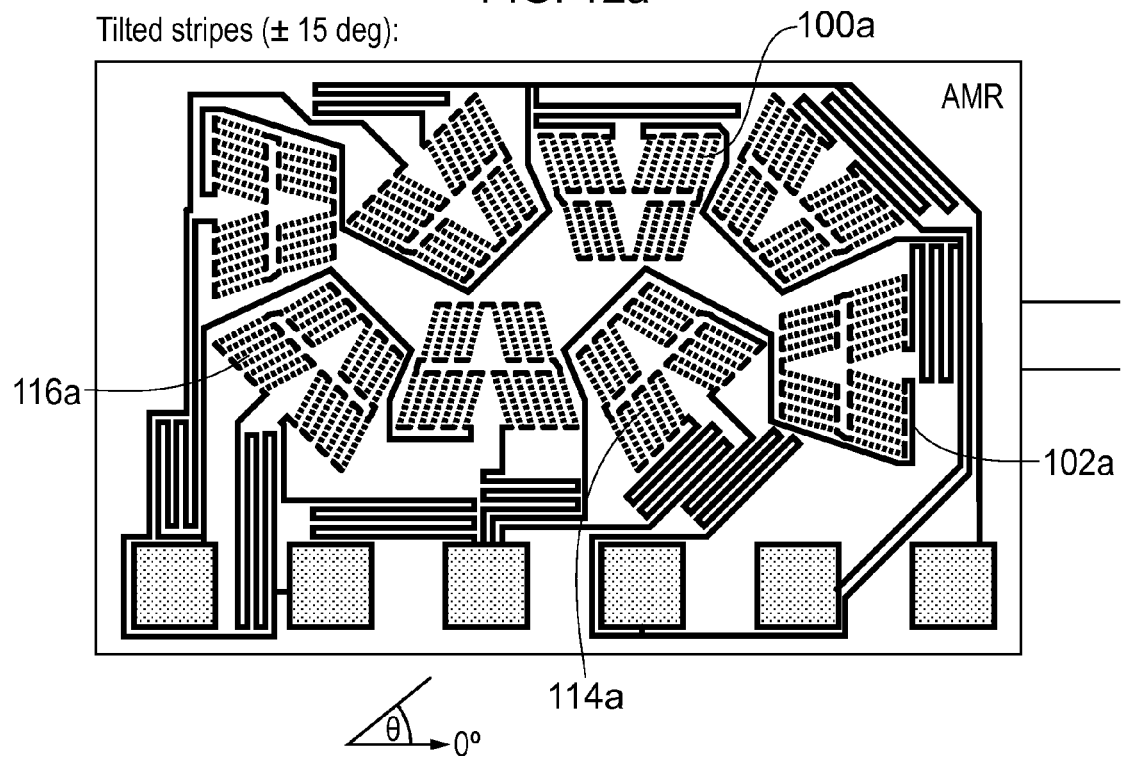
FIG. 13a shows a sensor configuration constituting an embodiment of the present invention and FIG. 13b compares the measured output of two bridges having magneto-resistive elements offset with respect to their notional sense directions with the idealized sinusoidal response.
Figure 13B:
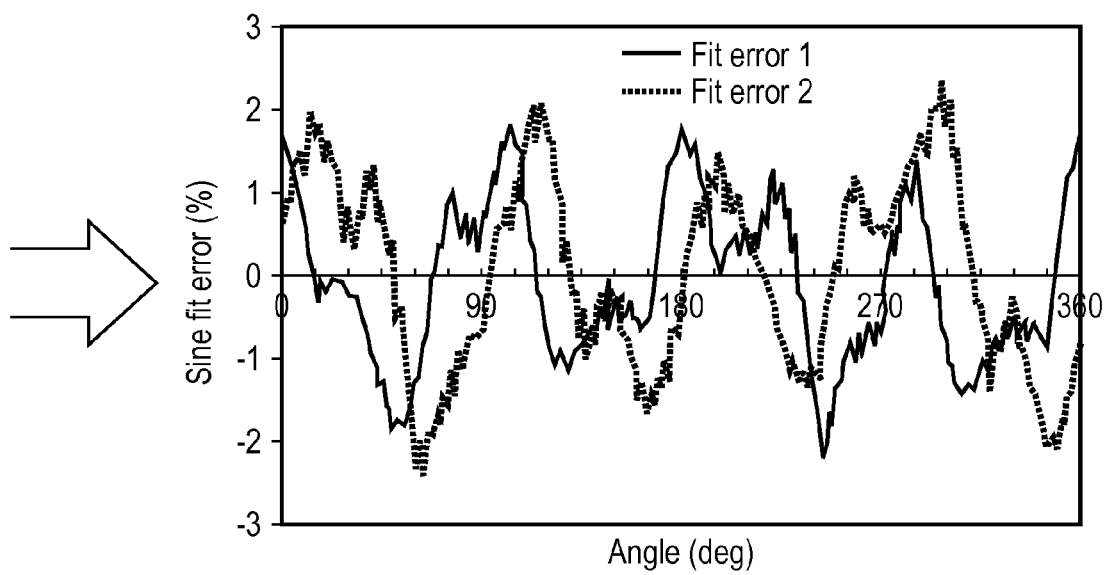

FIG. 13a shows a modified array where each of the individual sensing arrays has been replaced by an array for which half the magneto-resistive elements have been tilted by 15° in first direction, and the other half of the elements have been tilted by 15° in a second direction such that, taken as a whole each array has the still has the same primary sensing direction. Thus array 100a which corresponds to array 100 of FIG. 12a has elements at 75° and 105°. Array 102a which corresponds to array 102 has elements at 15° and 345°. Array 116a which corresponds to array 116 has elements at 30° and 60°. Array 114a which corresponds to array 114 has elements at 120° and 150°. FIG. 13b shows the corresponding fit errors and it can be seen that the maximum error has been reduced from around 5% to around 2%.

Figure 14:
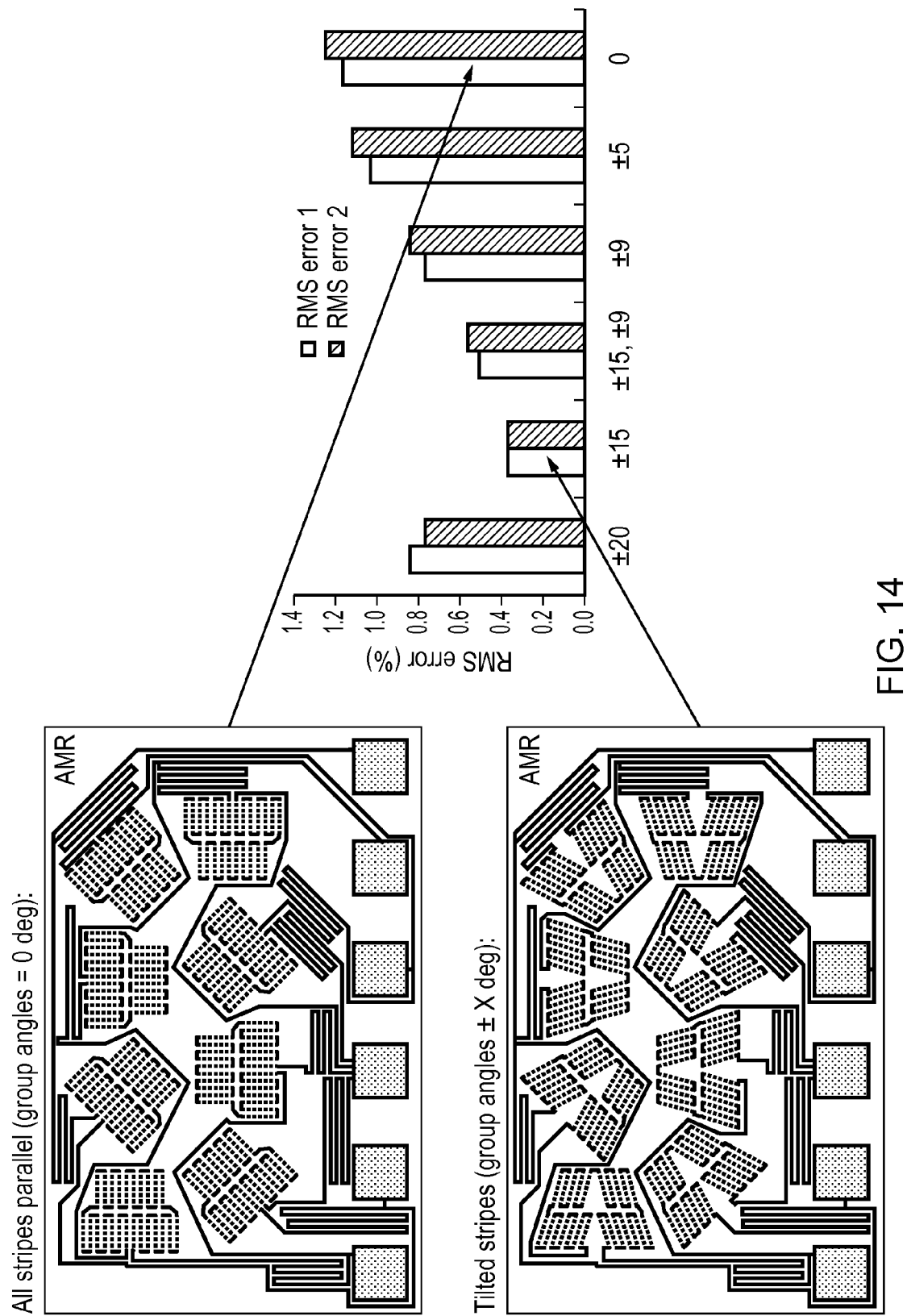
FIG. 14 shows a modeled plot of RMS percentage error as a function of angular tilt of the magneto resistive elements away from the notional primary direction.

FIG. 14 compares estimated RMS fit errors for prior art arrays, and arrays shown here where they are split into groups of magneto-resistive elements inclined with respect to the sensing direction. Simulations have been performed for arrays inclined at ±5°, ±9, ±15°, ±20° to a primary direction and also a further embodiment where the magneto-resistive elements were divided into four groups, with two groups inclined at ±9° and two groups inclined at ±15° with respect to the primary sensing direction of the array. It can be seen that the estimated error reduces from about 1.3% for the prior art array in which all the sensing elements are parallel to the primary sensing axis to about 0.4% where the arrays are inclined at ±15°. These angular ranges are not limiting, but it is likely that most arrays will be inclined between 2° and 25° from the primary direction.

The reduction in error effectively means that the sensor can be used with a weaker magnet, and achieve error performance similar to that of the prior art systems, or the sensor can be used with the same strength magnet and achieve enhanced linearity.

In further embodiments, the spaces between the magneto-resistive elements may also be packed with magneto-resistive material, so as to make the overall properties of the sensor array more closely approximate a square or a rectangle having a relatively low aspect ratio. Thus the non-sensing portion of the magneto-resistive material can influence and reduce the shape anisotropy.

An advantage of this approach is that all the groups of magneto-resistive elements are symmetrically disposed about the primary direction, and each group of the array has notionally the same resistance and size and the group that is its mirror image. This avoids having to fabricate groups of dissimilar size or resistance.

Figure 15:
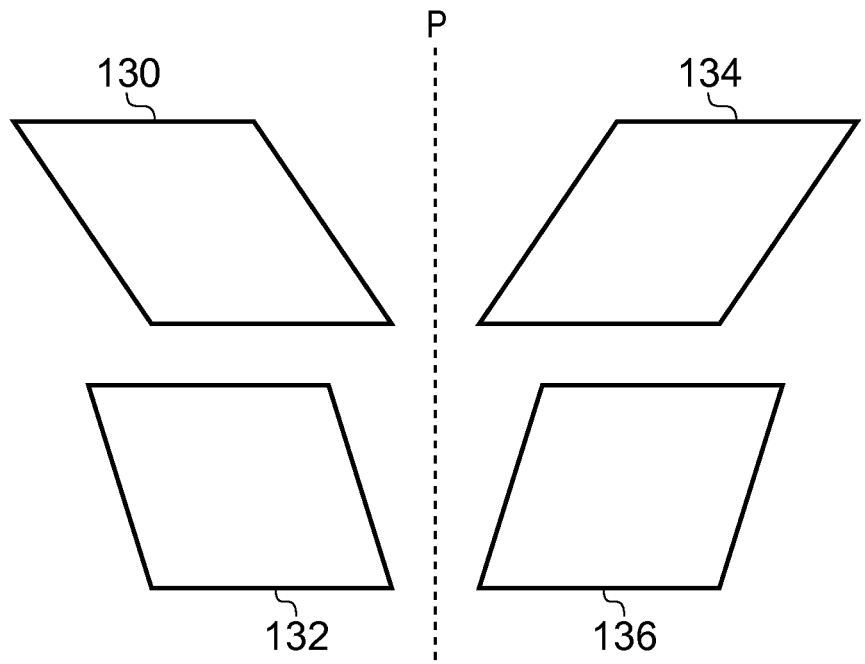
FIG. 15 shows a sensor having four arrays.

The number of elements in each array may be varied form that shown. In tests, each group could be composed of between 14 and 42 magneto-resistive elements, but these numbers are not limiting. It is however advantageous that the combined resistance of the elements in one group matches that of the other group. This may be achieved by using equal numbers of elements in each group, where lengths and widths of element are matched between the groups. A sensor may comprise more than 2 groups of magneto-resistive elements, as shown in FIG. 15. Here groups of elements 130 and 132 are angled in a first direction, but at different angles. These groups are mirrored by groups 134 and 136 about the primary direction P.

Figure 16:
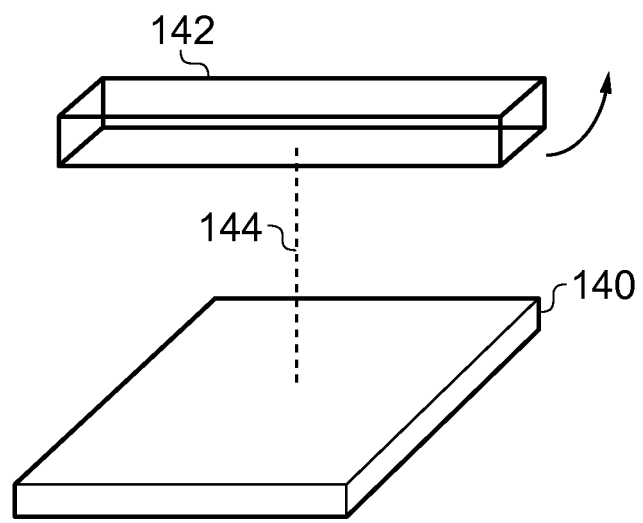
FIG. 16 illustrates an example of the relative positions of a sensor and a rotating magnet.

In use, and as shown in FIG. 16, the sensors may be formed on a substrate 140. The sensors need not be on the upper surface of the substrate 140, and hence are not shown in the schematic view of FIG. 16. A magnet 142 may rotate about axis 144. If, when viewed from above the magnet rotates in an anti-clockwise direction, then groups 136 and 134 form an advanced signal response compare to the primary direction P, and groups 130 and 132 form a delayed response.

It should be noted that the all the sensing elements within an array need not have the same length, width or aspect ratio. Variation in sensing element dimensions may be exploited to improve packing of the sensors onto the substrate, and/or to reduce the angular error exhibited by the sensor. The magneto-resistive elements within each group may be interconnected by the same material that is used to form the magneto-resistive elements, or a different interconnection material (copper, aluminum, gold etc) may be used to provide electrical connection between series connected elements. Similarly, the arrays of magneto-resistive elements may be interconnected by the same material used to form the magneto-resistive elements, or by another conductive material.

Figure 17:
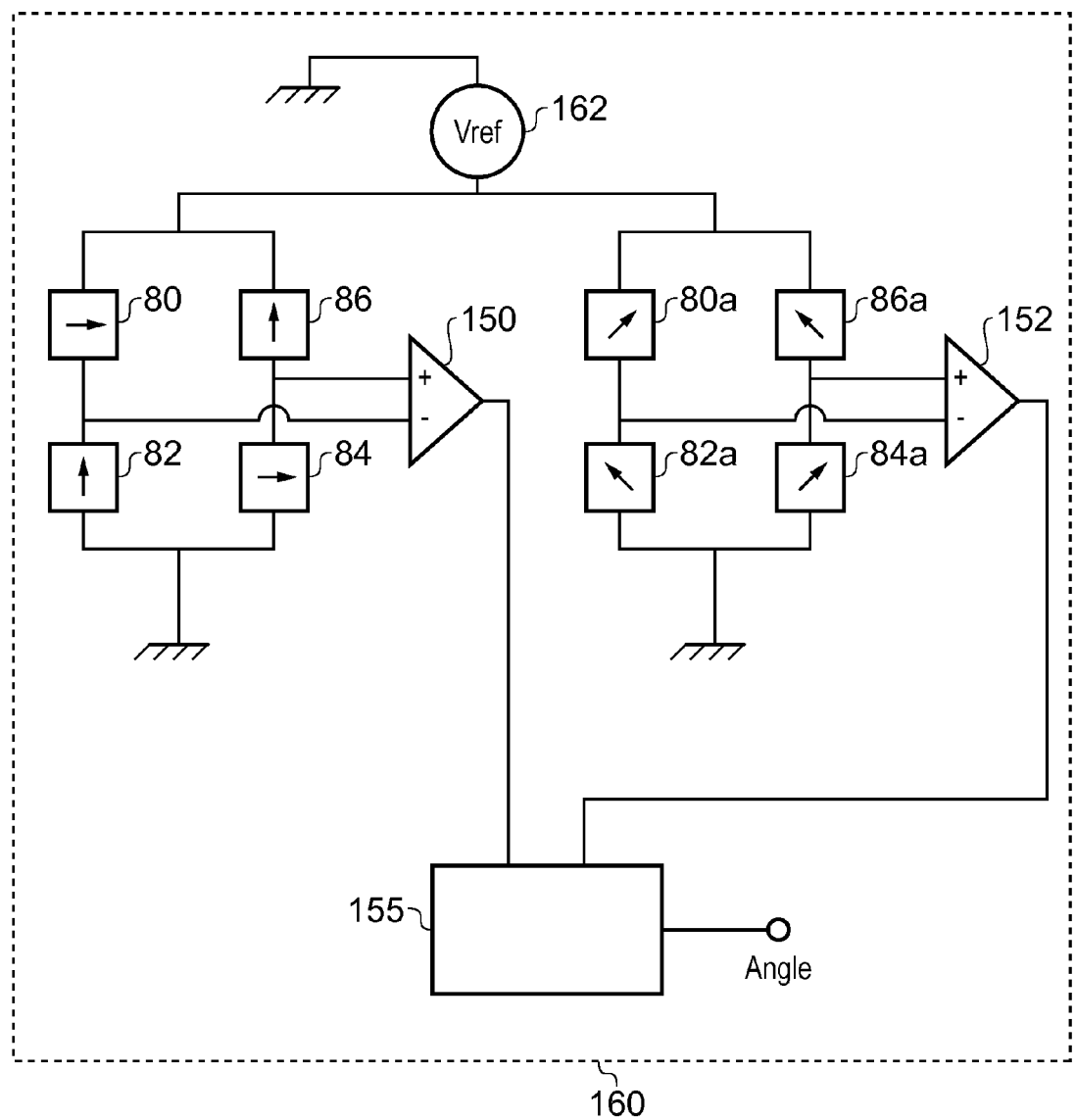
FIG. 17 is a schematic diagram of an integrated circuit implementing a magnetic field direction sensor.

The sensor bridges, for example as described hereinbefore with respect to FIGS. 13, 14, 15 and 16 may be provided within an integrated circuit package. Thus, as shown in FIG. 17 each sensor bridge may be connected to a respective operational amplifier 150 and 152 which may be formed in the semiconductor substrate which carries the magneto-resistive sensors. Outputs of the amplifiers 150 and 152 can be provided to a signal processing circuit 155 which may implement a processing function, for example the Atan 2 function so as to output a measurement of angle. The processing circuit may perform its function in the analog or digital domains, and may include analog to digital converters and digital logic circuits in order to derive the output signal. The integrated circuit, schematically bounded by the chain line 160 may also include a voltage reference 162 for providing a relatively stabilized voltage to drive the magneto-resistive arrays. In alternative embodiments the analog values output by the amplifiers 150 and 152 may be conveyed to other integrated circuits for processing.

The arrangements described herein can provide simple and robust angular position measurement, and find utility in industrial, automotive, and aeronautical industries as well as within consumer products.

It is thus possible to provide an improved sensor.

What is claimed is:

1. A magnetic direction sensor, comprising a first array of magneto-resistive elements, said first array forming a resistance unit having a first array primary direction and wherein some but not all of the first array of magneto-resistive elements are inclined at a first angle with respect to the first array primary direction, and all of the remaining magneto-resistive elements of the first array are inclined with respect to the first array primary direction, wherein at least a portion of the remaining magneto-resistive elements of the first array are inclined at a second angle with respect to the first array primary direction, wherein the second angle is different from the first angle.

2. A magnetic direction sensor as claimed in claim 1, in which a first plurality of magneto-resistive elements of the first array are orientated at the first angle with respect to the first array primary direction, and a second plurality of magneto-resistive elements of the first array are orientated at the second angle with respect of the first array primary direction, and where the second angle is substantially the same size and opposite sign to the first angle.

3. A magnetic direction sensor as claimed in claim 2, in which electrical responses from the first and second pluralities of magneto-resistive elements are combined.

4. A magnetic direction sensor as claimed in claim 2, in which the first array is connected in series with a second array substantially identical to the first array but forming a second resistance unit having a second array primary direction substantially orthogonal to the first array primary direction.

5. A magnetic direction sensor as claimed in claim 4, further comprising a third array and a fourth array of magneto-resistive elements forming third and fourth resistance units, respectively, in which the first and second arrays co-operate with the third and fourth arrays in a bridge configuration.

6. A magnetic direction sensor as claimed in claim 5, comprising a second bridge, where the primary directions of the sensor arrays in the second bridge are rotated with respect to the corresponding arrays of the first bridge.

7. A magnetic direction sensor as claimed in claim 2, in which the first and second angles lie between 2° and 25° from the first array primary direction.

8. A magnetic field direction sensor as claimed in claim 2, in which the first array further comprises a third plurality of magneto-resistive elements orientated at a third angle with respect to the first array primary direction and a fourth plurality of magneto-resistive elements orientated at a fourth angle with respect to the first array primary direction, wherein the third and fourth angles are different from each other.

9. A magnetic direction sensor as claimed in claim 1, wherein the resistance unit is disposed between two consecutive nodes.

10. A method of improving performance of a magnetic field direction sensor, said sensor employing elongate magneto-resistive elements to form a resistance unit to measure a direction of magnetic field with respect to a primary direction of the resistance unit, the method comprising adding advanced and delayed signals so as to correct for errors within a response characteristic of the sensor, wherein the advanced signal is provided by a first group of the magneto-resistive elements provided at a first angle with respect to the primary direction, the delayed signal is provided by a second group of the magneto-resistive elements provided at a second angle with respect to the primary direction, wherein the first and second angles are different, and there are no magneto-resistive elements of the resistance unit aligned with the primary direction.

11. A method as claimed in claim 10, in which the first group of magneto-resistive elements and the second group of magneto-resistive elements are connected in series between a first node and a second node of the resistance unit.

12. A method as claimed in claim 10, in which the aspect ratio of one or more magneto-resistive elements of the first group is used to adjust the contribution of the advanced signals to the output response.

13. A method as claimed in claim 10, in which the angle of one or more magneto-resistive elements of the first group is used to control the contribution of the advanced signal.

14. A method as claimed in claim 10, in which the aspect ratio or angle of one or more magneto-resistive elements of the second group is used to control the contribution of the delayed signal.

15. A method as claimed in claim 10, further comprising providing a plurality of magnetic field direction sensors, wherein the magnetic field direction sensors are provided in a bridge array so as to provide a substantially linear response.

16. A method as claimed in claim 10, in which a magnetic field is provided by a magnet having a magnetic axis substantially parallel to a plane containing the magnetic field direction sensor.

17. A magnetic direction sensor comprising:
a first array of magneto-resistive elements forming a first resistance unit having a first primary sensing direction, the first array comprising at least a first group and a second group of magneto-resistive elements,
wherein magneto-resistive elements of the first group are provided at a first angle to the primary sensing direction,
wherein magneto-resistive elements of the second group are provided at a second angle to the primary sensing direction,
wherein the second angle is different from the first angle,
wherein at least one advanced signal relative to a nominal response of the first primary sensing direction is provided by the first group of the magneto-resistive elements, wherein at least one delayed signal relative to the nominal response of the first primary sensing direction is provided by the second group of the magneto-resistive elements, wherein an output of the first array of magneto-resistive elements is a sum of the at least one advanced signal and the at least one delayed signal.

18. A magnetic direction sensor as claimed in claim 17, wherein the first array is disposed between a bridge output node and a voltage potential node.

19. A magnetic direction sensor as claimed in claim 17, further comprising a second array of magneto-resistive elements forming as a second resistance unit having a second primary sensing direction, wherein the second primary sensing direction is substantially orthogonal to the first primary sensing direction.

20. A magnetic direction sensor as claimed in claim 17, further comprising a third and fourth arrays of magneto-resistive elements respectively forming a third and fourth resistance units, wherein the first, second, third, and fourth arrays of magneto-resistive elements are in a bridge configuration.

* * * * *